United States Patent [19]
Jelks et al.

[11] Patent Number: 4,612,085
[45] Date of Patent: Sep. 16, 1986

[54] PHOTOCHEMICAL PATTERNING

[75] Inventors: Edward C. Jelks, Dallas, Tex.; Michael R. Melloch, West Layfayette, Ind.

[73] Assignee: Texas Instruments Incorporated, Dallas, Tex.

[21] Appl. No.: 722,250

[22] Filed: Apr. 10, 1985

[51] Int. Cl.⁴ .................. B44C 1/22; C03C 15/00; C23F 1/02; B29C 17/08
[52] U.S. Cl. .................... 156/643; 118/728; 156/646; 156/656; 156/657; 156/659.1; 156/662; 156/668; 156/345; 204/298; 204/192.35 427/38; 427/53.1; 427/70
[58] Field of Search .............. 156/643, 646, 656, 657, 156/659.1, 662, 663, 667, 668, 345; 204/164, 192 EC, 192 E, 298; 252/79.1; 427/38, 39, 53, 69, 70, 256, 282, 294–296; 118/728, 50.1, 620, 624; 219/121 LM

[56] References Cited

U.S. PATENT DOCUMENTS

| | | | |
|---|---|---|---|
| 2,841,477 | 7/1958 | Hall | 156/646 |
| 3,113,896 | 12/1963 | Mann | 156/643 X |
| 3,122,463 | 2/1964 | Ligenza et al. | 156/643 X |
| 3,364,087 | 1/1968 | Solomon et al. | 156/646 X |

Primary Examiner—William A. Powell
Attorney, Agent, or Firm—Carlton H. Hoel; James T. Comfort; Melvin Sharp

[57] ABSTRACT

Formation of a plasma etch mask on a film on a substrate by photodecomposition of a gas at selective portions of the film's surface to deposit etch mask material and form the etch mask is disclosed. The photodecomposition by blanket illumination through a photomask and by direct write with a computer controlled laser are both disclosed. The formation of the etch mask can be immediately followed by the plasma etch without breaking vacuum.

11 Claims, 7 Drawing Figures

PHOTOCHEMICAL PATTERNING

BACKGROUND

The present invention relates to fabrication of integrated circuits, and, more particularly, to photochemical patterning of thin films during fabrication of integrated circuits.

Integrated circuits are typically fabricated by many step processes creating patterns of various materials in layers upon a semiconductor or other substrate. The patterned layers are usually formed by first depositing a layer of material over all the the preceding layers, then spinning on a photoresist, projecting light through a photomask with the desired pattern onto the photoresist thereby exposing it with the pattern, developing the photoresist to remove that portion not part of the pattern, and lastly, using the thus patterned photoresist as an etch mask for etching away the exposed portion (i.e., that portion not covered by the patterned photoresist) of the deposited layer of material. Such photoresist aided patterning has problems including particulate contamination and the contamination and cleanup required by use of the wet chemistry and atmospheric pressures involved.

Alternative patterning schemes not relying on photoresist include direct deposit of material only in the pattern regions. An example of such a process is as follows: flow a gas containing a compound of the material to be deposited over the substrate and photochemically decompose the gas to deposit the material at the pattern site by use of a laser. This system appears in Deutsch et al, U.S. Pat. No. 4,340,617 wherein an argon-helium laser is used to decompose trimethylcadmium to deposit cadmium. the problems of such a photochemical system include the poor electrical and mechanical properties of the deposited patterned material films.

Similarly, pyrolytic decomposition of a gas containing a compound of the material-to-be-deposited at pattern sites by locally heating the substrate selectively at pattern sites avoids the use of photoresist. An example of such a system appears in Herman et al., Materials Research Society Symposium Proceedings vol. 17 (1983) wherein a laser is used to provide the local heating and compounds such as nickel tetracarbonyl is decomposed to deposit patterns of nickel. Herman et al. also compare the rates of pyrolytic and photochemical depositions and conclude that the pyrolytic is generally preferable. Further, Herman et al., Material Research Society Conference (Boston, Nov. 15, 1983) report complete fabrication of a MOS transistor by pyrolytic deposition: silane was decomposed to deposit silicon, phosphine decomposed to dope silicon with phosphorous, hydrogen chloride and chlorine decomposed to etch silicon, tungsten hexafluoride decomposed to deposit tungsten, and so forth. However, such photoresist independent deposition and patterning yields layers of material that have poor electrical and mechanical properties.

Thus it is a problem of the known systems of deposition and patterning to provide both good electrical and mechanical properties of the deposited patterns of material and a dry and controlled atmosphere for the process sequence.

SUMMARY OF THE INVENTION

The present invention provides dry processes for forming etch masks for plasma etching of thin films. An etch mask is formed by photochemically depositing mask material selectively at the pattern site by a decomposition of a gas containing a compound of precursors of the mask material; a plasma etch using the etch mask may immediately follow the mask formation without breaking vacuum. The photochemical decomposition may be induced by a laser which permits high resolution patterns by use of short wavelengths. Further, after the etch mask has been formed, wet etching of the thin film could be employed, although the advantages of being able to perform both the mask formation and the etching without breaking a vacuum would be lost. This photochemical deposition of the mask material onto a thin film followed by plasma etching of the thin film solves the problem of the known systems in that good electrical and mechanical properties of a thin film deposited with standard techniques are preserved while the etch mask formation and the etching of the thin film with the mask are accomplished by a dry process and without breaking vacuum. Standard plasma etching chemistries can be used, and the mask material may be molybdenum oxide which has a lower vapor pressure than conventional photoresists.

DESCRIPTION OF THE PREFERRED EMBODIMENTS

Figure 1A:
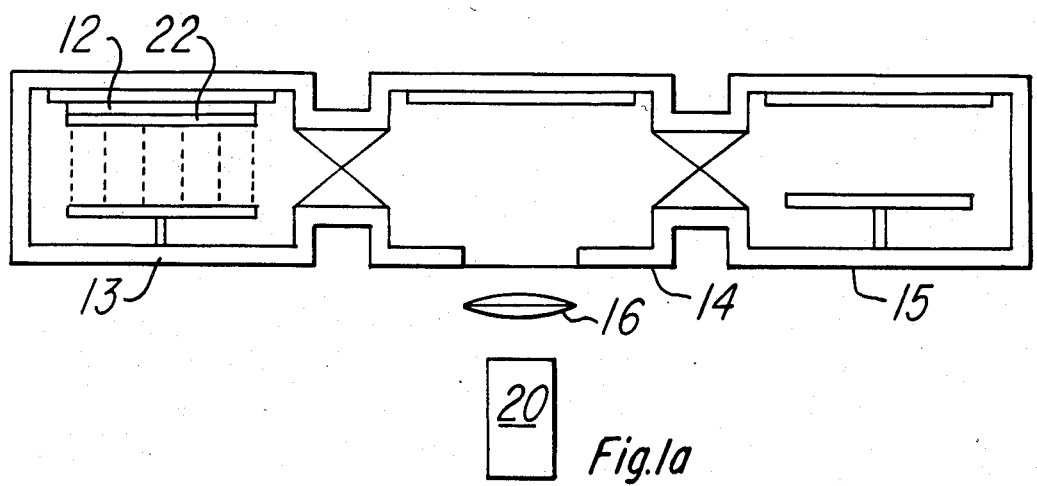
FIGS. 1A–E illustrate the sequence of process steps in a first preferred embodiment method of patterning.
Figure 1B:
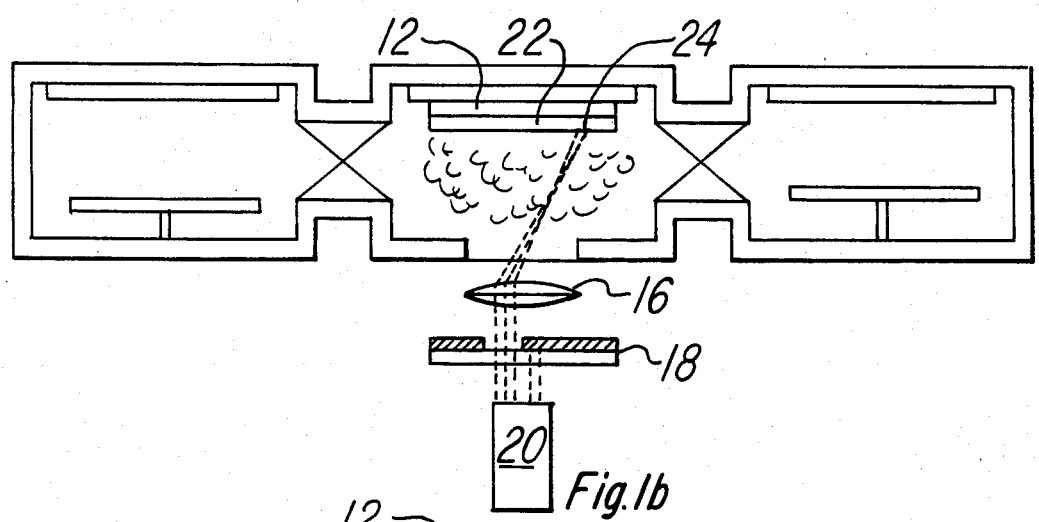
Figure 1C:
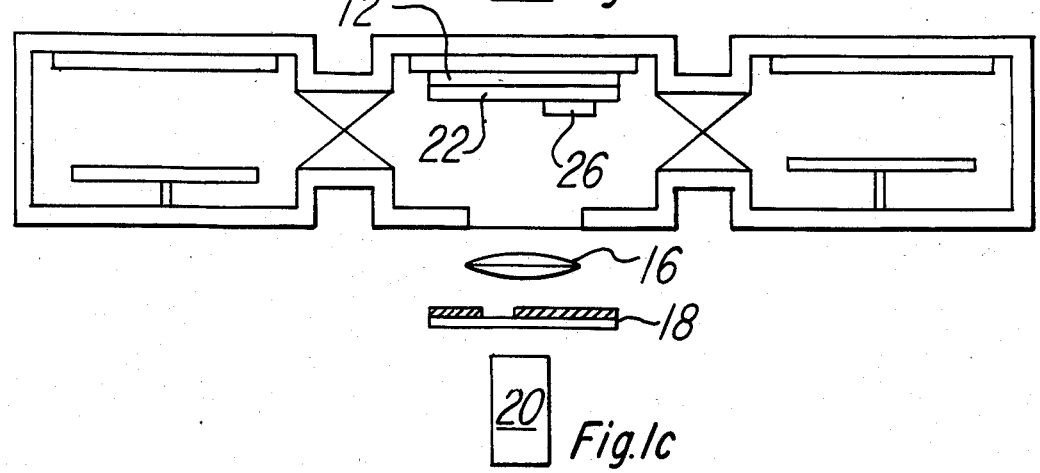

FIGS. 1A–E illustrate the steps in a first preferred embodiment method of patterning and etching of a chromium film on a silicon substrate. In more detail and turning to schematic FIG. 1A, silicon substrate 12 is located in vacuum processing chamber 13 which is connected to vacuum processing chambers 14 and 15, optical system 16, and ultraviolet laser 20; note that chambers 13, 14, and 15 are connected by automatic valves, substrate moving apparatus, and include other appurtenances such as vacuum pumps, gas inlets, plasma electrodes, and so forth, all of which are not shown for reasons of clarity. First a film of chromium 22 of thickness 900 A is deposited uniformly on substrate 12, such as by sputtering or evaporation as suggested by the left chamber 13; the thickness of substrate 12 and chromium film 22 has been greatly exaggerated for clarity in FIG. 1A. Next, substrate 12 with layer 22 is moved to middle chamber 14 which is filled with molybdenum hexacarbonyl to a pressure of about 100 mtorr; optical (uv) photomask 18 with the desired pattern is inserted into optical system 16, and laser 20 is activated. Optical system 16 is located and set so that photomask 18 and the film 22 surface of substrate 12 are conjugates (i.e., the pattern of photomask 18 is focussed at the surface of film 22); see FIG. 1B. Note that photomask 18 may be a chromium pattern deposited on glass transparent in the near uv. Laser 20 may be an excimer laser operating at about 2600 A; molybdenum hexacarbonyl photodecomposes at this wavelength. Thus on the surface of film 22 on substrate 12 molybdenum oxides 26 are formed from the photodecomposition of the hexacarbonyl, but only at the image 24 of the transparent portion of photomask 18. This disposition of molybdenum oxides 26 continues until about 300 A of oxide 26 has accumulated; the hexacarbonyl may be conveniently pumped through chamber to both replenish the decomposed gas near the surface and sweep out the volatile decomposition remnants. See FIG. 1C in which the thickness of deposited oxides 26 is greatly exaggerated for clarity. Also note that the formation of oxides 26 is a low temperature process.

Figure 1D:
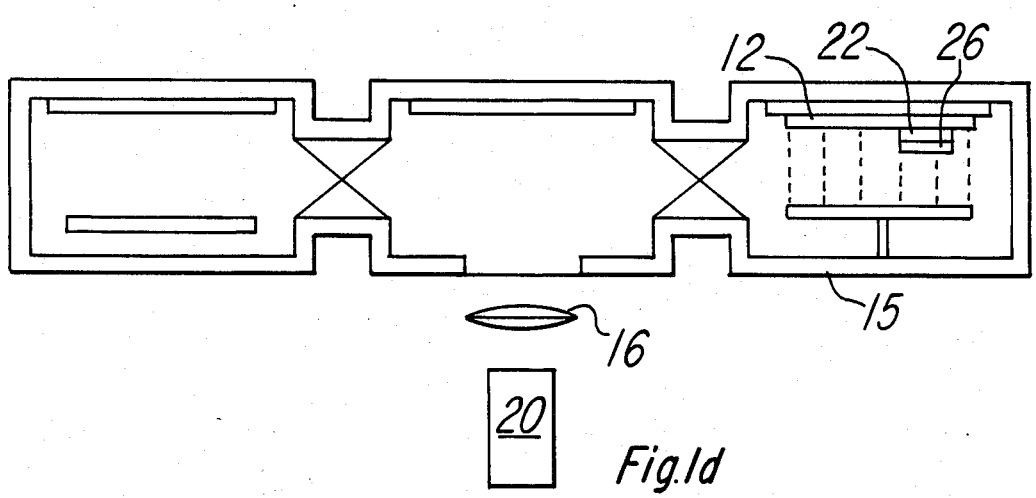
Figure 1E:
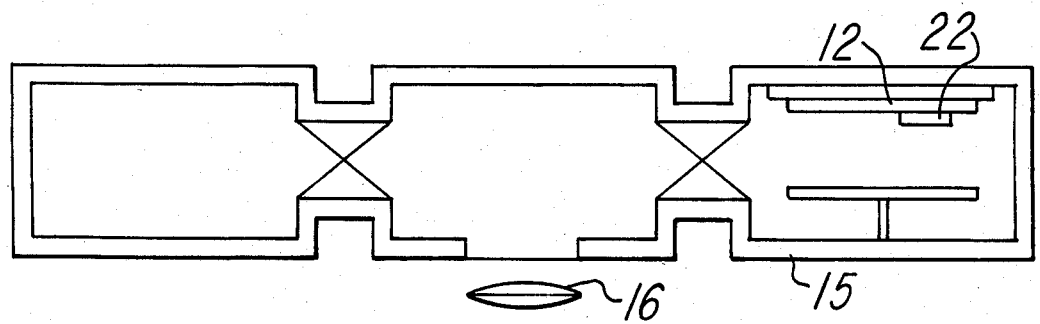

Molybdenum oxide 26 is now used at the etch mask for the plasma etching of chromium film 22 with chloroform and oxygen in a 2 to 1 ratio at a total pressure of 250 mtorr and at a power of 350 watts in a six inch diameter reactor; see FIG. 1D in which the etching is illustrated as occurring in the right chamber 15. Either a parallel plate or a barrel etcher may be used.

After the plasma etch of chromium 22, molybdenum oxide 26 may be stripped, if necessary, by a plasma etch such as CF4. This completes the patterning and etching of chromium film 22; see FIG. 1E.

Figure 2A:
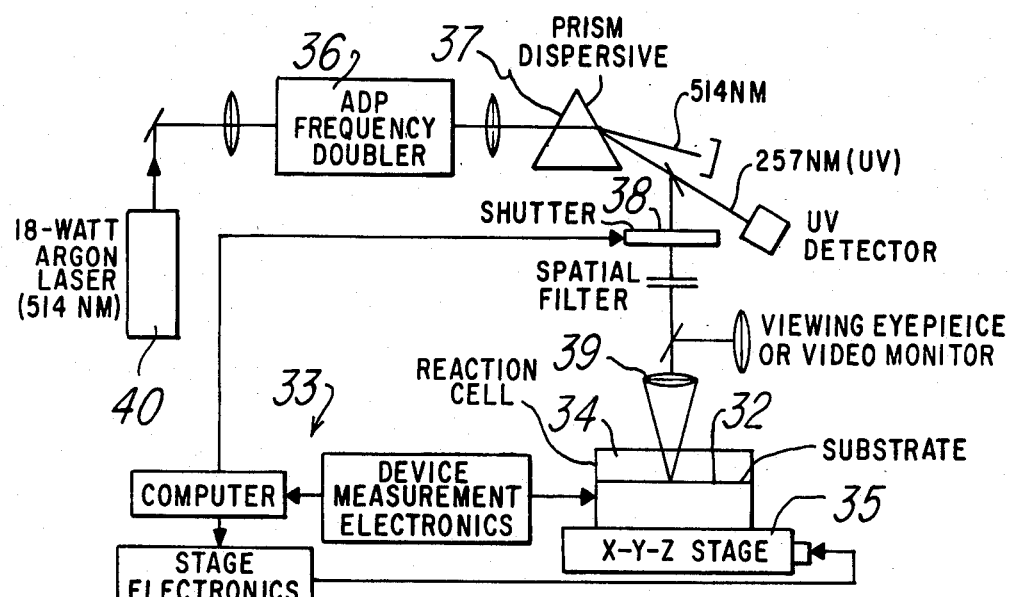
FIGS. 2A–B illustrate a second preferred embodiment method of patterning.
Figure 2B:
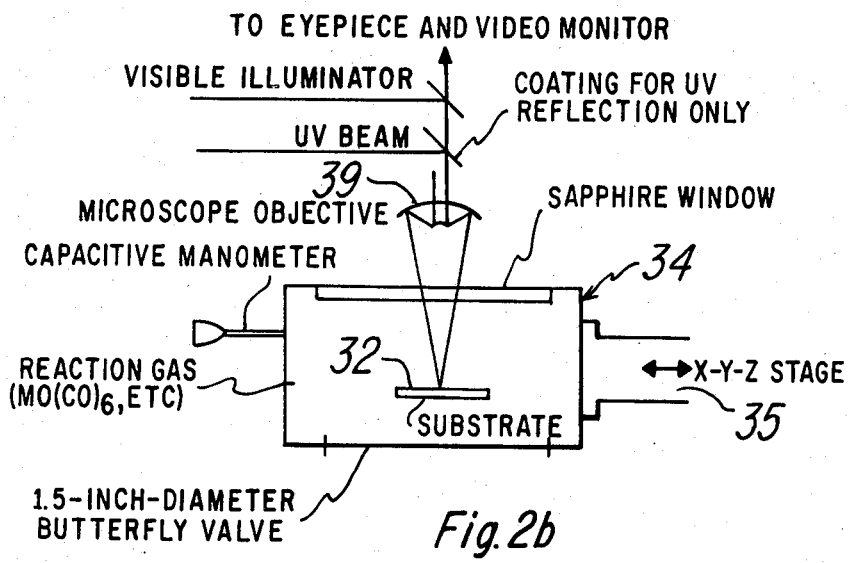

Second preferred embodiment method is heuristically illustrated in FIGS. 2A-B which show apparatus for use with the method; the apparatus includes vacuum reaction cell 34 containing substrate 32 (note that FIG. 2B is a close-up of the reaction cell from FIG. 2A); laser 40; an optical system including a frequency doubler 36, dispersive prism 37, shutter 38, and focussing lens 39 which may be a microscope objective lens (ultraviolet compatible); x-y-z stage 35 which controls the position of reaction cell 34 relative to the fixed laser and optical system; and control system 33 which includes a computer for driving both x-y-z stage 35 and shutter 38 plus a cell 34 position measurement device to drive the computer. The method is as follows to pattern a film of polyimide on substrate 32.

Substrate 32 has a 1 micron thick film of polyimide spon on and cured; then substrate 32 with the polyimide is inserted into reaction cell 34. The pattern to be formed in the polyimide is stored in the computer of control system 33. Reaction cell 34 is evacuated and then filled with molybdenum hexacarbonyl to a pressure of about 100 mtorr. Laser 40, which is an argon laser with wavelength 514 nm, is activated and its beam passes through ADP frequency doubler 36 and then through prism dispersive 37 to separate the doubled 257 nm beam from the undoubled beam. The 257 nm beam the passes through shutter 38 and lens 39; lens 39 focusses the beam to a single spot on the surface of the polyimide film on substrate 32. Control system 33 moves x-y-z stage 35, and thus cell 34 and substrate 32, so that the beam spot scans the surface of the polyimide film; simultaneously, control system 33 opens and closes shutter 38 so that the beam spot only appears on the surface of that portion of the polyimide film in the desired pattern. As with the first preferred embodiment, the molybdenum hexacarbonyl decomposes at the beam spot and deposits molybdenum oxides in the form of the desired pattern, thereby forming an etch mask. This formation of the oxide etch mask is a direct write method in contrast to the first preferred embodiment which used a photomask. The oxide etch mask is now used to etch the polyimide in a 1 to 1 argon to oxygen plasma at 250 mtorr total pressure and 350 watts of power to yield the desired pattern of polyimide.

MODIFICATIONS AND ADVANTAGES

Various modifications of the preferred embodiments can be made yet still remain within the scope of the invention. In particular, modifications include the following:

The substrate carrying the film to be patterned may be any convenient material; such as silicon, germanium, gallium arsenide, indium antimonide, oxide coated silicon, multiple layered structures on silicon, glass, etc. (i.e., the patterning of the film may be in connection with fabrication of semiconductor devices, with the fabrication of optical masks, etc.).

The film to be patterned may also be of any convenient material and any thickness as long as the plasma etch chemistry is compatible with the etch mask used; note that the pattern (etch mask) is formed on the surface of the film and does not depend upon the underlying characteristics of the film or substrate. Of course, the film could be dispensed with and the etch mask used to directly etch the substrate; however, this would not be taking full advantage of the invention.

The etch mask material must be available from the decomposition of a gas with the decomposition induced by light, directly (photolytic) or indirectly as by the heating of the surface of the film (pyrolytic). Further, the etch mask material should have a low etch rate compared to the material to be patterned, given the particular plasma etch chemistry used. Beyond this, any convenient mask material may be used. The light source may be laser, incandescent, or other with the only limiting features being power levels at various frequencies; for example, certain frequency bands must be driven to induce the photolytic decomposition and deposit the etch mask material, but other frequency bands may have to be avoided to preclude unwanted decomposition of portions of the film or substrate or even the just deposited etch mask material. Also, the low temperature aspect of the etch mask formula (no bakes as with organic photoresist) may be needed and may thus determine the light source.

Deposition of the etch mask material from decomposition of a liquid or a liquid film is also possible, although the advantages of vacuum dry processing would likely be lost.

The total pressure of the decomposable gas over the film may be varied according to the character of the gas, the power of the light source, the speed and quality of deposition, the nature of volatile gasses generated, and so forth. Pressures typically can range from the vapor pressure of the material down to a few millitorr for practical deposition rates. High pressures, up to 300 to 400 torr, would allow greater deposition rates.

We claim:

1. A method of forming a mask of a first material on a selected region on a surface of a substrate, comprising the steps of:
   (a) introducing a gas over said surface, said gas characterized by photodecomposition into said first material plus volatile other material; and
   (b) illuminating said surface only at said selected region, whereby said gas decomposes and deposits said first material on said selected region and forms said mask.

2. The method of claim 1 wherein:
   (a) said illuminating is performed by passing light through a photomask and onto said surface.

3. The method of claim 1, wherein:
   (a) said illuminating is performed by moving a spot of light on said selected region.

4. The method of claim 1, wherein:
   (a) the pressure of said gas over said surface is much less than atmospheric pressure.

5. A method of forming a mask of a first material on a selected region on a surface of a substrate, comprising the steps of:
- (a) introducing a gas over said surface, said gas characterized by thermal decomposition into said first material plus volatile other material; and
- (b) illuminating and thereby heating said surface only at said selected region, whereby said gas decomposes and deposits said first material on said selected region and forms said mask.

6. The method of claim 5, wherein:
- (a) said illuminating is performed by passing light through a photomask and onto said surface.

7. The method of claim 5, wherein:
- (a) said illuminating is performed by moving a spot of light on said selected region.

8. A method of forming a patterned film of first material on a substrate surface, comprising the steps of:
- (a) depositing a film of said first material on said surface;
- (b) introducing a gas over said first material, said gas characterized by photodecomposition into a second material plus volatile material; and
- (c) illuminating said film in a pattern, said illumination characterized by photodecomposition of said gas, whereby said gas decomposition forms said pattern of said second material.

9. A method of patterning and plasma etching a film of first material on a substrate, comprising the steps of:
- (a) depositing a film of said first material on said surface;
- (b) introducing a gas over said first material, said gas characterized by photodecomposition into a second material plus volatile material;
- (c) illuminating said film in a pattern, said illumination characterized by photodecomposition of said gas, whereby said gas decomposition forms said pattern of said second material; and
- (d) plasma etching of said first material using said patterned second material as an etch mask.

10. The method of claim 9, wherein:
- (a) said illuminating decomposition step and said plasma etching step are both performed at below-atmospheric pressures.

11. The method of claim 10, wherein:
- (a) said substrate remains at below-atmospheric pressure between said illuminating decomposition and said plasma etching steps.

* * * * *